United States Patent
Motohashi et al.

(10) Patent No.: US 9,459,284 B2
(45) Date of Patent: Oct. 4, 2016

(54) CONDUCTIVITY INSPECTION APPARATUS AND CONDUCTIVITY INSPECTION METHOD

(71) Applicant: Automotive Energy Supply Corporation, Zama-shi, Kanagawa (JP)

(72) Inventors: Yuta Motohashi, Murfreesboro, TN (US); Keisho Ishibashi, Tokyo (JP); Kiyohide Takimoto, Toyama (JP); Masatomo Mizuta, Kawasaki (JP); Takuya Takatsuka, Tokyo (JP)

(73) Assignee: AUTOMOTIVE ENERGY SUPPLY CORPORATION, Zama-Shi (JP)

( * ) Notice: Subject to any disclaimer, the term of this patent is extended or adjusted under 35 U.S.C. 154(b) by 89 days.

(21) Appl. No.: 14/378,047

(22) PCT Filed: Feb. 4, 2013

(86) PCT No.: PCT/JP2013/052432
§ 371 (c)(1),
(2) Date: Aug. 11, 2014

(87) PCT Pub. No.: WO2013/121902
PCT Pub. Date: Aug. 22, 2013

(65) Prior Publication Data
US 2015/0022228 A1 Jan. 22, 2015

(30) Foreign Application Priority Data

Feb. 13, 2012 (JP) ................. 2012-028344

(51) Int. Cl.
G01R 31/20 (2006.01)
G01R 1/067 (2006.01)
H01M 10/48 (2006.01)
G01R 31/36 (2006.01)
G01R 31/02 (2006.01)
H01M 10/04 (2006.01)

(52) U.S. Cl.
CPC ............ *G01R 1/0675* (2013.01); *H01M 10/48* (2013.01); *G01R 31/026* (2013.01); *G01R 31/3627* (2013.01); *H01M 10/0413* (2013.01); *H01M 10/0436* (2013.01)

(58) Field of Classification Search
CPC G01R 1/0675; G01R 31/26; G01R 31/3627; H01M 10/48; H01M 10/413; H01M 10/436
See application file for complete search history.

(56) References Cited

U.S. PATENT DOCUMENTS

| 5,871,861 A | 2/1999 | Hirokou et al. |
| 6,486,686 B1* | 11/2002 | Fukasawa .......... G01R 1/07314 324/754.07 |
| 6,703,162 B2 | 3/2004 | Shiota et al. |
| 6,897,668 B1* | 5/2005 | Hsu .................... G01R 31/2893 324/754.1 |
| 7,015,711 B2* | 3/2006 | Rothaug ............ G01R 31/2808 324/750.02 |

(Continued)

FOREIGN PATENT DOCUMENTS

| JP | 7-282841 A | 10/1995 |
| JP | 2002-324572 A | 11/2002 |

(Continued)

*Primary Examiner* — Minh N Tang
(74) *Attorney, Agent, or Firm* — Foley & Lardner LLP

(57) ABSTRACT

At least two needles (11, 12) are inserted from the surface of an outer covering film (200) such that the needles reach metal foils (252, 262) in the outer covering film (200), and the electrical connection state with an object inside of a structure covered with the outer covering film (200) is inspected. The electrical connection state is more reliably inspected.

4 Claims, 7 Drawing Sheets

(56) References Cited

U.S. PATENT DOCUMENTS

| 9,076,601 | B2 | 7/2015 | Yamashita et al. |
| 2001/0016279 | A1 | 8/2001 | Shiota et al. |
| 2012/0186071 | A1 | 7/2012 | Yamashita et al. |
| 2015/0260797 | A1 | 9/2015 | Yamashita et al. |

FOREIGN PATENT DOCUMENTS

| JP | 2003-197208 A | 7/2003 |
| JP | 2012-28023 A | 2/2012 |
| WO | WO 01/08248 A1 | 2/2001 |
| WO | WO 2011/040446 A1 | 4/2011 |

* cited by examiner (a)

(b)

CONDUCTIVITY INSPECTION APPARATUS AND CONDUCTIVITY INSPECTION METHOD

TECHNICAL FIELD

This invention relates to a conductivity inspection apparatus and a method thereof, and more specifically to a conductivity inspection apparatus and a method thereof which are configured to inspect a conductive state of a to structural member covered by a film in which a metal foil is sandwiched between resin films.

BACKGROUND ART

In recent years, a laminate film (also referred to as a laminate sheet) is used as an outer covering member for covering a power generation element of a battery for decreasing a weight of the battery, and decreasing a thickness of the battery. The laminate film has, for example, a structure in which an aluminum foil is stacked between a resin film and a resin film.

As a conduction (continuity) test method between this laminate film and the internal power generation element, there is a method of inserting a metal needle on a surface of the outer member of the laminate film, and measuring a resistance between this needle and a lead electrode extending from the power generation element (patent document 1).

In a normal laminate-packed battery, the internal power generation element and the laminate film are insulated so as not to leak the current to the laminate film which is the outer covering member (package) (cf. background art of the patent document 1). By applying the conventional art, it is possible to test the insulating state between the power generation element and the laminate film by inserting the needle from the surface of the laminate film, and measuring the resistance between this needle and the lead electrode extending from the power generation element.

However, the laminate film has a structure in to which the aluminum foil is sandwiched between the two resin films. Accordingly, when the needle is inserted from above on the surface of the laminate film, that is, the resin film, the needle may drag and wound the resin. In this case, the resin is wound around the needle, so that the needle and the aluminum foil are not contacted with each other. Consequently, it is not understand whether or not the power generation element and the aluminum foil of the laminate film are conducted with each other. The reliability of the conduction test is decreased. That is, even when the power generation element and the aluminum foil of the laminate film are conducted (short-circuited), the test result represents that there is no conduction.

PRIOR ART DOCUMENT

Patent Document

Patent Document 1: WO01/008248

SUMMARY OF THE INVENTION

It is, therefore, an object of the present invention to provide a conductivity inspection apparatus and a method thereof which are configured to inspect an electrical conductive state of a structural member which is covered with an outer covering film in which a metal foil is sandwiched by resin films.

A conductivity inspection apparatus according to the present invention comprises: at least two needles inserted from a surface of an outer covering film of a structural member covered with the outer covering film having a stacked film configuration in which a metal foil is sandwiched by resin films, to reach the metal foil; and an inspection means configured to inspect a conduction state between a member within the structural member, and the two needles.

A conductivity inspection method comprises: inserting at least two needles from a surface of an outer covering film of a structural member covered with the outer covering film having a stacked film configuration in which a metal foil is sandwiched by resin films, to reach the metal foil; and inspecting a conduction state between a member within the structural member, and the two needles.

By the present invention, at least two needles are inserted. Accordingly, when one of the at least two needles is contacted on the metal foil, it is possible to inspect the conduction state. Consequently, it is possible to decrease the generation of the inspection failure, and to improve the reliability of the inspection, relative to a case in which the inspection is performed by one needle.

DESCRIPTION OF EMBODIMENTS

Figure 1:
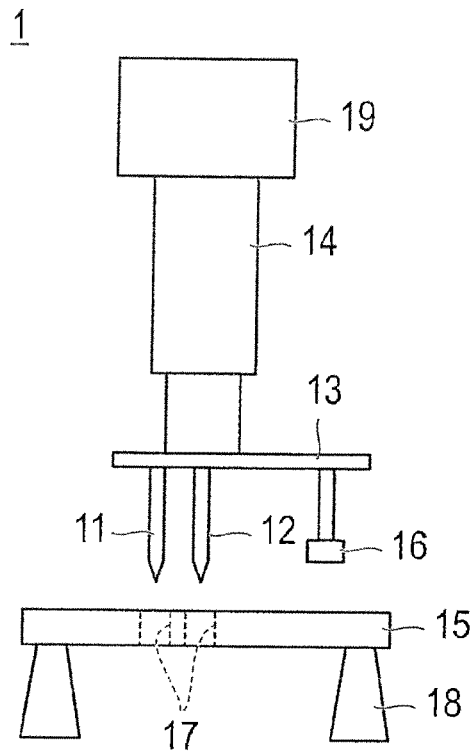
FIG. 1 is a schematic view for illustrating a conductivity inspection apparatus of a battery which is covered with a laminate film in a first embodiment.

Hereinafter, embodiments of the present invention are illustrated with reference to the drawings. Besides, the same element has the same symbol in the explanation of the drawings. Repetitive explanations are omitted. Moreover, sizes and ratios of members in the drawings are exaggerated for the explanation. These sizes and ratios are different from actual sizes and actual ratios.

First Embodiment

FIG. 1 is a schematic view for illustrating a conductivity inspection apparatus of a battery covered with a laminate film (an outer covering film) in a first embodiment.

This conductivity inspection apparatus 1 includes two conductive needles 11 and 12, a support portion (section) 13 integrally supporting the two needles 11 and 12, an air cylinder 14 arranged to move the support portion 13 in upward and downward directions, and a stage 15 holding the battery at a predetermined position. Moreover, the support portion (section) 13 is provided with an elastic pad 16 which is arranged to press tabs of the battery against the stage 15, at a position of the tabs of the battery which is mounted on the stage 15, as described below.

Two needles 11 and 12 are not specifically limited as long as the needles are conductive members such as a stainless, a copper, an iron, and other alloys. A tip end of each of the needles has acute angle. A middle portion (body portion) of each of the needles has a thickness of about 0.3-1 mm. Needless to say, the needles are not limited to these as long as the needles can be inserted in the laminate film.

The two needles 11 and 12 are mounted, respectively, to the support portion 13 through insulators (insulations) (not shown). In this case, each of the insulators is a rubber or a resin. However, the insulators are not specifically limited to these. The needles 11 and 12 are mounted through the insulator so that the support portion 13 is not electrically short-circuited with the needles 11 and 12. Moreover, an elastic pad 16 is also mounted.

The air cylinder 14 is arranged to move the support portion 13 apart from and toward the stage 15. That is, in FIG. 1, the air cylinder 14 moves the support portion 13 in the upward and downward directions. The support portion 13 integrally supports the two needles 11 and 12. Accordingly, it is possible to always move the two needles 11 and 12 together. Moreover, at the same time, the elastic pad 16 is moved together. Besides, a portion of the air cylinder 14 which is not operated is fixed to 19 such as a support (fulcrum) and a frame (not shown).

In place of the air cylinder 14, it is possible to use an oil cylinder, a mechanism of a combination of a motor and a gear, other actuators, and so on.

Figure 2:
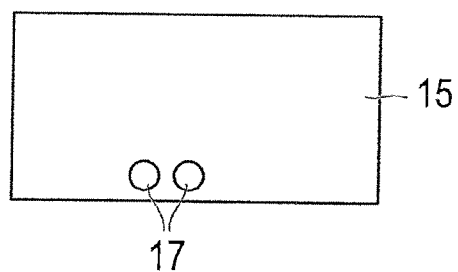
FIG. 2 is a plan view showing a battery mounting surface of a stage.

The stage 15 is supported by a base (seating) 18. FIG. 2 is a plan view showing a battery mounting surface of the stage 15. As shown in the drawing, holes 17 are opened in the stage 15 at positions corresponding to the two needles 11 and 12. Each of the holes 17 can have any size as long as the needles 11 and 12 are not contacted on the stage 15 when the needles 11 and 12 are moved in the downward direction. Moreover, the holes 17 can be polygon, in addition to a circular shape shown in the drawing. The shape of the hole 17 is not limited. However, in a case in which the hole is too large, it is not possible to support the laminate film when the needles 11 and 12 are inserted in the laminate film by moving the needles 11 and 12 in the downward direction (described below in detail). Accordingly, it is necessary that the hole has an adequate size. For example, it is possible to set to the size by actually inserting the needles so that the needles 11 and 12 are surely inserted in the laminate film without contacting on the stage, and so that the variation of shape of the laminate film is small. In case of the circular hole 17, about 2-5 mm is sufficient for the size. Needless to say, the size of the hole 17 can be larger than this, for example, about 1 cm, in consideration of the safety so as not to contact on the stage 15. However, in a case where the size of the hole 17 is too large, the laminate film is distorted by the pressure when the needles 11 and 12 are inserted, so that the needles 11 and 12 are not inserted in the forward direction. Accordingly, it is necessary that the hole 17 has the adequate size as described above.

Moreover, at least a portion of the stage surface at a position of the tabs of the battery mounted on the stage is conductive. With this, the electric conduction between the battery tabs and it is attained. Besides, the insulation sheet (not shown) is sandwiched between the stage 15 and the base 18, or base 18 and the floor surface, so as to attain the insulation state.

In a case where the only portion of the stage 15 at the position of the battery tabs is set to have the conductive property, the conductive pad (not shown) is provided to that portion. A portion between the conductive pad and the stage 15 may be set to have the insulation property so as to keep the insulation property between the entire of the stage 15 and the battery (the battery tabs).

The thus-constructed stage 15 and the conductive pad become a conductive terminal for attaining an electric conductivity (electric continuity) with an inside of the structure which is covered with the laminate film.

The elastic pad 16 is arranged to press the mounted battery tabs from above for improving the conductivity between the tabs of the battery mounted on the stage 15, and the stage 15 (or the conductive pad). The elastic pad 16 may be, for example, a sponge, a rubber, a felt, other elastic resins and so on. This elastic pad 16 is arranged to press the battery tabs toward the stage 15 at the same time when the support portion 13 is moved in the downward direction and the needles 11 and 12 are inserted in the laminate film.

Besides, in a case where this elastic pad 16 is provided, a portion between the stage 15 and the elastic pad 16 is set to have the insulation property, and the surface of the elastic pad 16 is set to have the conductive property. In this way, the conductivity may be attained by a portion between this conductive elastic pad 16 and the battery tabs.

Moreover, when other conductive means (for example, conductive clip and so on) are provided in addition, the elastic pad 16 needs not to be provided. Moreover, in a case in which the other conductive means is provided, it is not necessary that the stage 15 and a part of the stage 15 is set to have the conductivity.

Figure 3:
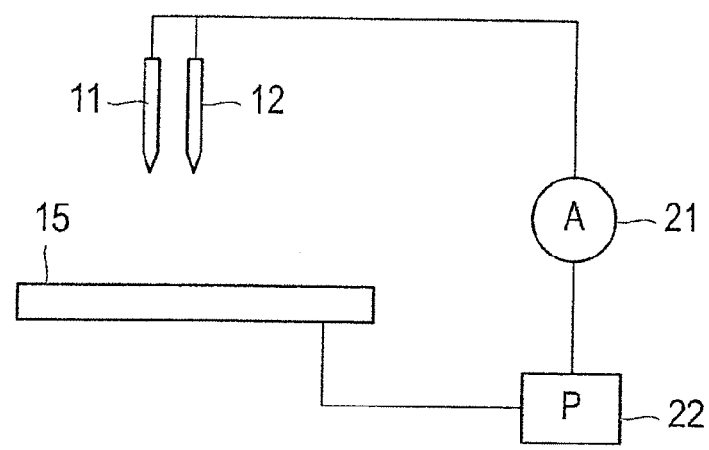
FIG. 3 is a circuit diagram showing an electric circuit of the conductivity inspection apparatus.

FIG. 3 is a circuit diagram showing an electric circuit of this conductivity inspection apparatus 1.

As shown in the drawing, the two needles 11 and 12 are connected in parallel to one end side (first end side) of the ammeter 21. The other end side (second end side) of the ammeter 21 is connected to one terminal of a power supply 22. The other end side (second end side) of the power supply 22 is connected to the stage 15 (or the conductive pad on the stage). This circuit becomes the inspection means.

Besides, it is optional to provide a switch in the circuit, if necessary. Moreover, the power supply 22 may be a direct current power supply, and an alternating current power supply. However, the ammeter 21 is used in accordance with the power supply 22. In case of the direct current power supply, the ammeter for the direct current is used. In case of the alternating current power supply, the ammeter for the alternating current is used. The electric voltage of the power supply 22 may be low voltage since the conductivity test is merely performed. For example, 1V-5V is sufficient. However, in a case where electric breakdown withstand voltage of the laminate film is measured, the voltage of about twice the electric voltage of the power generation element positioned in the inside sealed by the laminate may be applied. These voltages may be arbitrarily set in accordance with that object of the test. These are not specifically limited.

Moreover, in this circuit diagram, the power source 22 and the ammeter 21 are shown. That is, this is the configuration of the resistance measuring circuit. Accordingly, this is the same with a case where the resistance measuring device is used between the two needles 11 and 12 which are connected in parallel, and the stage 15 (or the conductive pad on the stage 15) (in this case, the resistance measuring device is the inspection means).

Operations of the thus-constructed conductivity inspection apparatus 1 are illustrated.

First, the battery which is a tested object, and which is sealed by the laminate is briefly illustrated.

Figure 4:
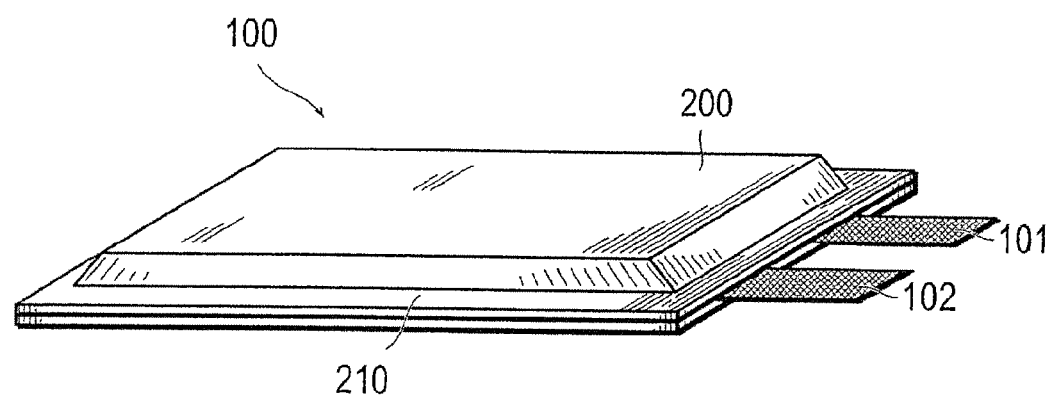
FIG. 4 is a perspective view showing an outside of the battery which is sealed by a laminate.

FIG. 4 is a perspective view showing an outside of the battery which is sealed by the laminate. As one knows, the laminate film has a stacked (laminated) film structure in which the metal foil (for example, aluminum foil) is sandwiched between the resin films. Then, the battery 10 which is covered with (sealed by) the laminate film is entirely covered with the laminate film 200. The battery 100 has the power generation element disposed inside the battery 100. In the battery shown in the drawings, two tabs which are electrode terminals of the battery are pulled out from one side (a positive electrode tab 101 and a negative electrode tab 102 are pulled out. The laminate film 200 is bonded and sealed at the periphery of the laminate film 200 by the heat seal and the adhesive.

Figure 5:
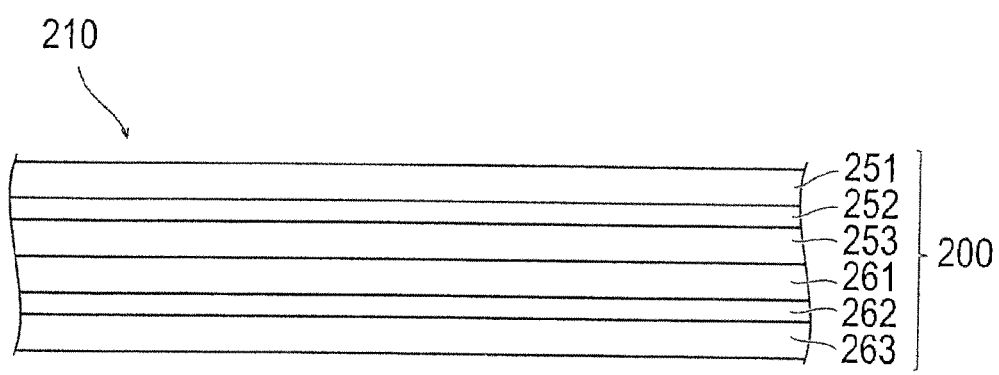
FIG. 5 is an enlarged sectional view of a portion of an edge of a laminate film.

FIG. 5 is an enlarged sectional view of an edge portion of the laminate film. As shown in the drawing, in the edge portion 210 which is bonded, two laminate films 200 are superimposed. Accordingly, in a case where only this portion is viewed, the laminated film is (has) total 6 layers of a first resin film 251, a first aluminum foil 252, a second resin film 253, a third resin film 261, a second aluminum foil 262, and a fourth resin film 263.

Figure 6:
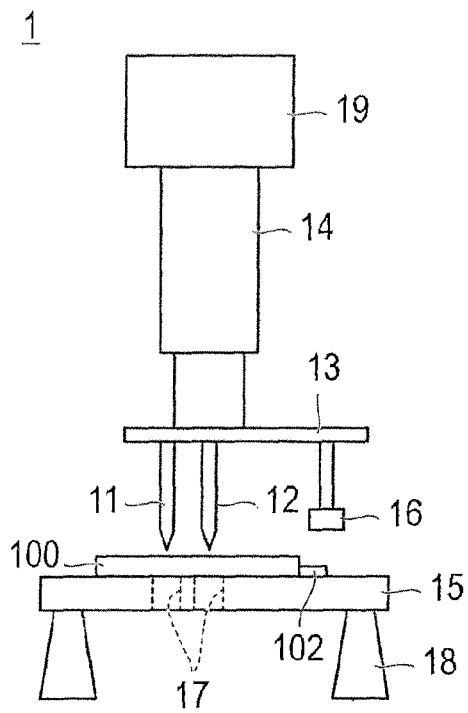
FIG. 6 are illustrative views for illustrating an operation of the conductivity inspection apparatus.
Figure 6:
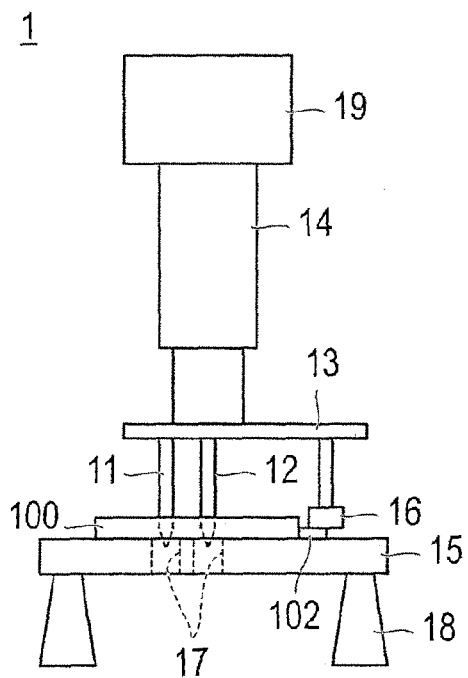
Figure 7:
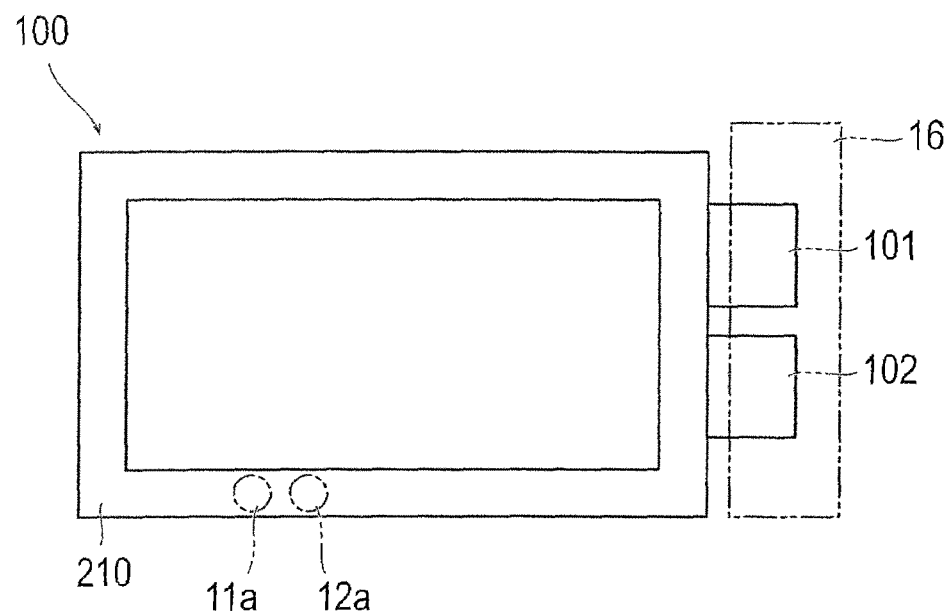
FIG. 7 is a plan view showing a needle insertion position of the battery in the first embodiment.

The operation of the conductivity inspection apparatus 1 is illustrated. FIG. 6 are illustrative views for illustrating the operation of the conductivity inspection apparatus 1. FIG. 6(*a*) is a schematic front view before the needle insertion in a state where the battery is mounted on the stage. FIG. 6(*b*) is a schematic front view after the needle insertion. FIG. 7 is a plan view showing the needle insertion position of the battery.

First, as shown in FIG. 6(*a*), the battery which is an inspected object is mounted on the stage 15. As shown in FIG. 7, the battery is mounted on the stage 15 so that the needles 11 and 12 are inserted in portions 11*a* and 12*a* of the edge portion 210 of the battery which are represented by two dot chain circles, and so that the elastic pad 16 (a two dot chain line in FIG. 7) is positioned at positions of the tabs 101 and 102. That is, the positions of the needles 11 and 12 and the elastic pad 16 are disposed in accordance with the configuration of the battery which is the inspected object. The elastic pad 16 presses the tabs 101 and 102, so that it is possible to concurrently attain the conductions of both the stage 15 or the conductive pad, and the positive electrode tab 101 and the negative electrode tab 102.

Then, as shown in FIG. 6(*b*), the needles 11 and 12 with the support portion 13 are moved in the downward direction by actuating the air cylinder 14. With this, the needles 11 and 12 are inserted in the edge portion 210 of the laminate film. At this time, the two needles 11 and 12 are inserted in the edge portion 210 of the laminate film. Moreover, at the same time, the elastic pad 16 presses the tabs of the battery against the stage 15.

Then, the value of the ammeter 21 is read. If the power generation element within the battery and the aluminum foil 252 and/or 262 of the laminate film 200 are conductive with each other, the current flows, and it is sensed by the ammeter 21.

With this, it is possible to perform the inspection of the conduction between the power generation element within the battery and the aluminum foils 252 and/or 262. Besides, in a case where the short-circuit is defined as the failure, the product is good if it is confirmed by the ammeter 21 that the current does not flow. On the other hand, in a case where the aluminum foil is the insulating shield, the product is good if it is confirmed by the ammeter 21 that the current flows.

Besides, in case of using the conductive pad, it is possible to inspect the conduction states between the respective positive electrode tab 101 and negative electrode tab 102, and the laminate film 200, by providing the conductive pads, respectively, to the positive electrode tab 101 and the negative electrode tab 102. In this case, the inspection is performed by switching the conductive pads provided to the positive electrode tab and the negative electrode tab while the needles 11 and 12 are inserted. With this, it is possible to check whether the laminate film 200 is connected to the positive electrode system connected to the positive electrode tab 101, or the negative electrode system connected to the negative electrode tab 102, in the internal power generation element.

Figure 8:
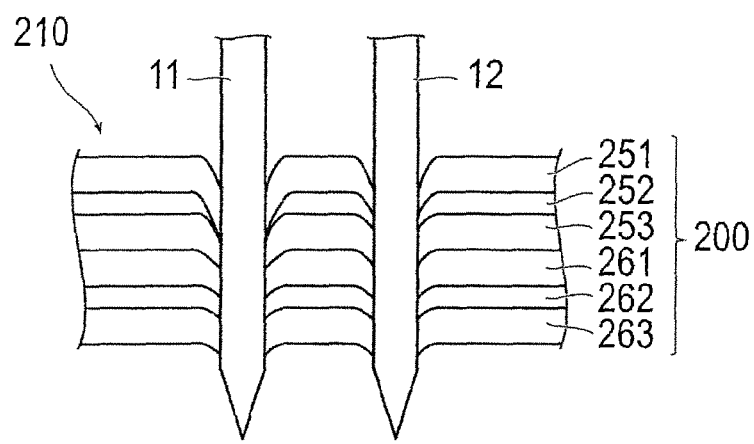
FIG. 8 is a sectional view showing an inner section of the portion of the edge of the laminate film in which two needles are inserted.

In this case, a state of the edge portion 210 of the laminate film in which the needles 11 and 12 are inserted is illustrated. FIG. 8 is a sectional view showing an internal section of the edge portion 210 of the laminate film in which the two needles 11 and 12 are inserted.

As shown in the drawings, in the edge portion 210 of the laminate film, when the needles are inserted, the resin film is dragged (pulled in) by the needles by inserting the needle, and the resin film may be wound around the needles. The thus-dragging is generated for the expansion and the contraction (elasticity) of the resin film which is the elastic member. Moreover, in accordance with the various causes of the minute difference of the thickness of the resin film, and the difference of the shape of the surface, the winding may be generated or be not generated, and the amount of the dragging are different. In the state shown in the drawing, the first resin film 251 is largely dragged by the needle 11. In this case, the needle 11 and the first aluminum foil 252 are not contacted with each other. On the other hand, the resin film is not largely dragged by the needle 12. Accordingly, the needle 12 and the first aluminum foil 252 are contacted with each other.

In this state, if the power generation element and the aluminum foil 252 are short-circuited, it is not possible to judge the short-circuit by this since the needle 11 and the aluminum foil 252 are not contacted with each other. However, in the first embodiment, another needle 12 is connected in parallel. This needle 12 does not drag the first resin film 251. Accordingly, it is possible to sense the short-circuit since the needle 12 is contacted with the aluminum foil 252.

Besides, FIG. 8 shows one example of the contact failure (poor contact) of the needle and the aluminum foil. This contact failure is not necessarily generated in this way. The contact failure between the needle and the aluminum foil may be generated in the various portions.

The first embodiment described above attains following effects.

In case of the inspection performed by the only one needle, if that one needle drags the resin film and the one needle does not contact on the aluminum foil, it may not be possible to sense the conduction state (the short-circuit and so on) between the laminate film 200 and the internal power generation element. On the other hand, in the first embodiment, the two needles 11 and 12 are inserted in parallel. Accordingly, even if one of the two needles does not contact on the aluminum foil due to the dragging, it is possible to inspect the conductive state if the other needle is effectively operated. Consequently, it is possible to decrease the generation of the inspection failure relative to a case where the inspection is performed by the one needle, and to improve the reliability of the inspection.

Moreover, it is possible to perform the inspection if the other of the needles 11 and 12 is alive even when the one of the needles 11 and 12 is simply brought to the failure state (for example, the breaking (disconnection) on the path between the needles 11 and 12, and the ammeter 21), in addition to the dragging of the resin film.

Furthermore, in the first embodiment, the needles 11 and 12 are inserted in the edge portion 210 in which the laminate film 200 is bonded. Accordingly, it is possible to perform the conduction inspection without providing the influence to the inside of the produced battery.

Moreover, the stage 15 or the conductive pad is contacted on the tab 101 or 102 of the battery, so that this serves as the conductive terminal for attaining the electrical conduction with the internal power generation element. Accordingly, the electric circuit for the inspection is constituted merely by mounting the battery 100 on the stage 15. There are no trouble of mounting the clip to the tabs 101 and 102 of the battery as the operation (actuation) for the inspection. It is possible to readily perform the inspection process.

Second Embodiment

Figure 9:
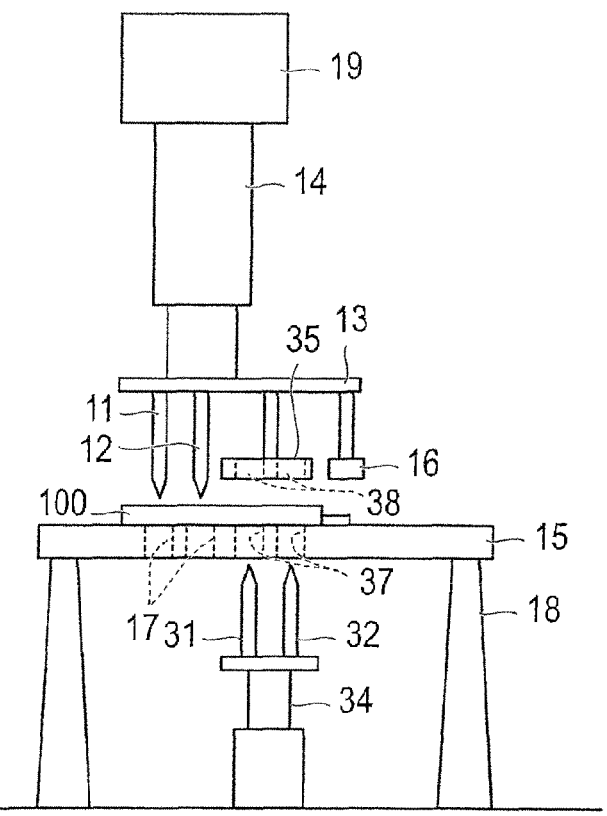
FIG. 9 is a schematic view for illustrating a conductivity inspection apparatus of a battery covered with a laminate film in a second embodiment.

FIG. 9 is a schematic view for illustrating the conductivity inspection apparatus of the battery which is covered with the laminate film (outer covering film) in a second embodiment.

The conductivity inspection apparatus 2 according to the second embodiment is an apparatus in which a structure in which needles 31 and 32 are inserted from below is added to the structure in which the needles 11 and 12 are inserted from above in the first embodiment. That is, in a case where an upper side of the battery is a first surface and the lower side of the battery is a second surface, the needles 11 and 12, and 31 and 32 are inserted, respectively, from the first surface side, and the second surface side which is opposite to the first surface.

Accordingly, in the second embodiment, there are provided two needles 31 and 32 disposed below the stage 15, a lower support portion 33 which supports these needles 31 and 32, and a lower air cylinder 34 which moves the lower support portion 33 toward and apart from the stage 15. Furthermore, the support portion 13 is provided with a pressing pad (retaining pad) 35 arranged to press to (retain) so that the edge portion 210 of the laminate film 200 is not moved apart when the needles 31 and 32 are inserted from below at portions near the upper two needles 11 and 12. The stage 15 is provided with holes 37 through which the needles 31 and 32 pass so that the needles 31 and 32 from below are inserted in the laminate film. Moreover, the pressing pad 35 is provided with holes 38 so that the needles 31 and 32 from below are not contacted. These holes 37 and 38 may be a size so as not to contact on the needles 31 and 32, and so as to prevent the laminate film from deforming and moving apart, like the hole 17 provided in the stage 15 in the first embodiment. Moreover, sponge, rubber, other elastic resin and so on which has the insulation property and an elasticity are used for the pressing pad 35. Other structures are identical to those of the first embodiment. Accordingly, the explanations are omitted.

Figure 10:
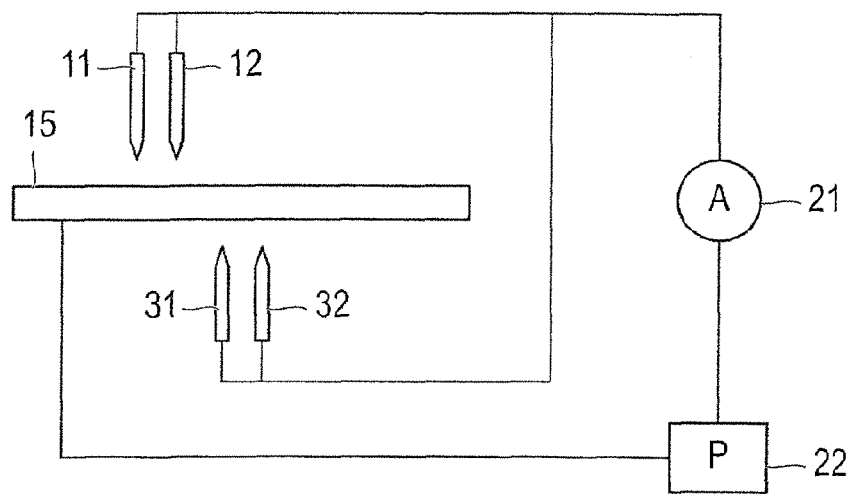
FIG. 10 is an electric circuit diagram in the second embodiment.

FIG. 10 is an electric circuit diagram of the second embodiment. As shown in the drawing, four needles 11 and 12, and 31 and 32 are connected to the ammeter 21 in the parallel manner. The other circuit configuration is identical to that of the first embodiment. Accordingly, the explanation is omitted.

Figure 11:
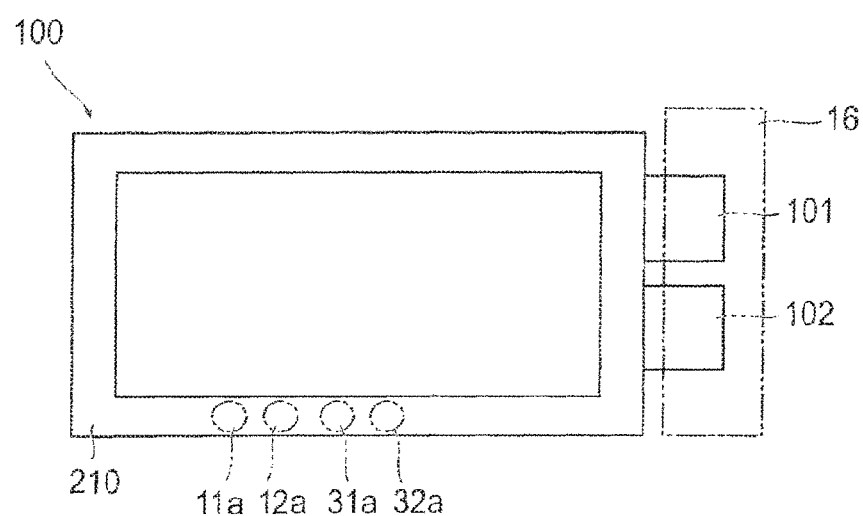
FIG. 11 is a plan view showing a needle insertion position of the battery in the second embodiment.

FIG. 11 is a plan view showing positions of the battery in which the needles are inserted in the second embodiment.

As shown in the drawings, the needles 11 and 12 from above are inserted at positions shown by two dot chain line circles 11*a* and 12*a* of the edge portion 210 of the laminate film. Moreover, the needles 31 and 32 from below are inserted at positions shown by two dot chain line circles 31*a* and 32*a* of the edge portion 210 of the laminate film. The elastic pad 16 (a two dot chain line in FIG. 11) is set to the position of the tabs 101 and 102, like the first embodiment.

In the operation of the conductivity inspection apparatus 1 in the second embodiment, first, the upper needles 11 and 12 are moved in the downward direction so as to be inserted in the edge portion 210 of the laminate film 200. At this time, the pressing member 35 is abutted on the edge portion 210 of the laminate film 200. Accordingly, the needles 31 and 32 are also moved from below in the upward direction. With this, at least one of the four needles 11, 12, 31, and 32 is contacted on the aluminum foil of the laminate film 200.

Figure 12:
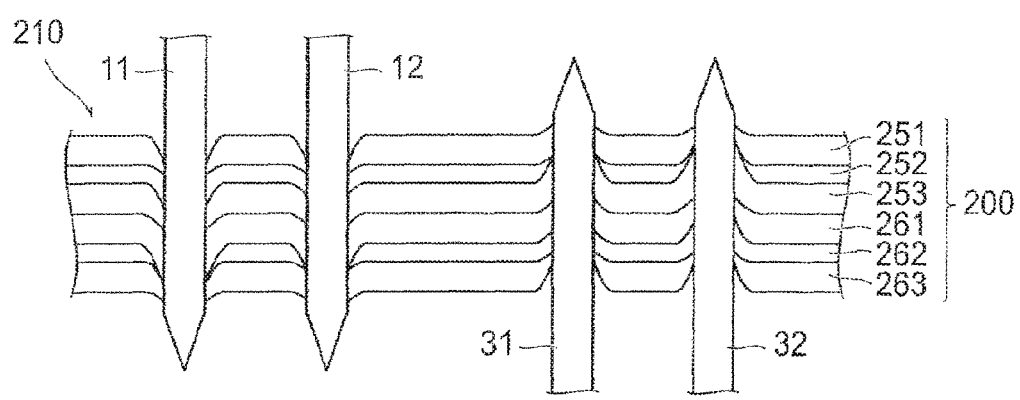
FIG. 12 is a sectional view showing an inner section of a portion of an edge of the laminate film in which four needles are inserted.

FIG. 12 is a sectional view showing an internal section of the edge portion of the laminate film in which the four needles 11, 12, 31, 32 are inserted.

As shown in the drawing, when the needles are inserted, the resin film may be pulled in (dragged) by the needles by inserting the needles, and the resin film may be wound around the needles. In particular, this failure may be generated with respect to the aluminum foil on the side farther from the surface in which the needle is inserted. As shown in the drawing, two layer resin films 253 and 261 are disposed on the second aluminum foil 262 which is positioned at the farther position when it is viewed from direction in which the needles 11 and 12 are inserted (from the upward direction of the drawing). Accordingly, when the needles 11 and 12 are inserted from above, it is easy to be wound by the needles 11 and 12 since the two layer resin films are disposed on the second aluminum foil 262. It is identical in a case of the needles 31 and 32. Moreover, the adhesion layer (not shown) may be further disposed between the resin films 253 and 261. In this case, the adhesion may be also wound.

Accordingly, in the second embodiment, the needles 31 and 32 are also inserted from below. With this, the needles 31 and 32 are unlikely to wind the second aluminum foil 262 in which the needles 11 and 12 from above are easy to generate the contact failure (poor contact), since there is only one layer of the fourth resin film 263 with respect to the needles 31 and 32. Consequently, even when the needles 11 and 12 from above generate the contact failure with the second aluminum foil 262, the needles 31 and 32 from below are unlikely to generate the contact failure (poor contact) with the second aluminum foil 262. Therefore, the reliability of the conduction inspection is improved. It is identical in a case of the needles 31 and 32 from below. The needles 31 and 32 from below are easy to generate the contact failure with respect to the first aluminum foil 252. However, the needles 11 and 12 from above is unlikely to generate the contact failure with respect to the first aluminum foil 252. Accordingly, the reliability of the conductive inspection is improved.

The following effects are attained in the second embodiment.

The two needles 11 and 12, and the two needles 31 and 32 are inserted, respectively, from the both surface sides (the upper side and the lower side in the drawings) of the battery which is covered with the laminate film 200. In the edge portion 210 of the laminate film 200 having a structure in which the two layers are superimposed, a position (layer) at which the resin is easy to be wound are different in accordance with the direction in which the needles 11 and 12, and 31 and 32 are inserted. Accordingly, the inserted needles 11 and 12, and 31 and 32 maintain the contact with the aluminum foil on the side on which the resin film is unlikely to be wound. Accordingly, it is possible to further improve the reliability of the inspection.

Moreover, the needle is inserted at the edge portion 210, similarly to the first embodiment. Accordingly, the produced battery is not influenced. Moreover, the identical effects identical to those of the first embodiment are attained.

Hereinabove, the embodiments to which the present invention is applied are explained. However, the present invention is not limited to these embodiments. For example, the number of the needles 11 and 12 which are inserted from the one side is not limited to two. This number may be three or four. However, in a case where many needles are inserted, the product has many holes. This is not preferable. Accordingly, in the case of inserting from the one surface (the first embodiment), and in the case of inserting from the both surfaces (the second embodiment), it is preferable that the total number of the holes is within about twelve (described later).

Moreover, the two needles 11 and 12 are inserted near each other in the edge portion 210. However, the needles 11 and 12 may be apart from each other. For example, two needles are inserted, respectively, at sides on which the tabs do not protrude (three sides in the example of FIG. 4), so that total six needles are inserted. In a case where it is similarly performed from both the both surface sides, two needles are inserted from one side. By summing the three sides, the number is the total twelve needles.

Moreover, in a case where the needles are inserted from the both surfaces of the battery like the second embodiment, it is optional to use the apparatus according to the first embodiment, to inspect by inserting the needles 11 and 12 from the one side surface of the battery, and to inspect by inserting the needles 11 and 12 by turning over the same battery. By performing this way, the structure of the apparatus is simplified, and it is possible to attain the effects identical to those of the inspection in which the needles are inserted from the both side surfaces like the second embodiment.

Furthermore, the battery which is the inspected object is not limited to the battery shown in FIG. 4. The battery may have any shape as long as the battery (it) is covered with the laminate film 200. For example, unlike FIG. 4, the battery may be the battery in which the positive electrode tab 101 is pulled out from the one side, and the negative electrode tab 102 is pulled out from the side which is opposite to that side. In this case, in the apparatus configuration, the positive electrode tab 101 and the negative electrode tab 102 are conducted, respectively, to the stage 15 or the conductive pad on the stage 15.

Moreover, it is possible to inspect as long as the structure of the laminate film 200 is a structure in which the resin film sandwiches the metal foil other than the aluminum foil. Moreover, the total number of the resin film and the total number of the metal foil are not limited.

Moreover, in a case where the needles are inserted from the both surface sides of the battery like the second embodiment, the one needle may be inserted from the one surface sides, so that the total two needles may be inserted. Even in this structure, at least one needle of the two inserted needles is contacted on the internal aluminum foil. In particular, the reliability of the inspection is improved merely by inserting one needle from the both sides relative to a case of inserting the two needles from the same surface, since the readiness of the wounding of the resin are different in accordance with the inserting direction as described above.

Moreover, the needles are inserted into the laminate film to penetrate through. However, it is sufficient that the needles reach the metal foil within the laminate film (the outer covering film). It is unnecessary to penetrate through. When the needle does not penetrate through, the hole provided to the stage is not needed.

Moreover, in the embodiments, the battery which is covered with the laminate film is shown as the structural member which is covered with the laminate film in which the metal foil is sandwiched by the resin film. However, the inspected object of the present invention is not limited to this. That is, as long as it is the structural member which is covered with the laminate film, it is possible to use for the conduction inspection between the internal member within that, and the metal foil constituting the laminate film.

The present invention can employ a structure other than a structure explained herein is added, or a structure in which a part does not exist can be employed as long as it includes a structure defined in claims. The present invention can includes various configurations.

The invention claimed is:

1. A conductivity inspection apparatus arranged to perform a conduction inspection of a battery having a power generation element, wherein the power generation element is sandwiched by two superimposed outer covering films each of which has a stacked film configuration in which a metal foil is sandwiched by resin films, and which are superimposed and sealed at an edge portion of a periphery of the two superimposed outer covering films, the edge portion having a stacked structure in which a first resin film, a first metal foil, a second resin film, a third resin film, a second metal foil, and a fourth resin film are stacked in this order, wherein the conductivity inspection apparatus comprises
a first needle configured to be inserted from a first surface of the edge portion which corresponds to the first resin film, to reach the second metal foil, which is farther from the first surface;
a second needle configured to be inserted from a second surface of the edge portion which is opposite to the first surface, and which corresponds to the fourth resin film, to reach the first metal foil, which is farther from the second surface; and
an inspection section configured to inspect a conduction state between the power generation element of the battery, and the first needle and the second needle.

2. The conductivity inspection apparatus as claimed in claim 1, wherein the conductivity inspection apparatus includes a third needle configured to be inserted from the first surface of the edge portion, and a fourth needle configured to be inserted from the second surface of the edge portion; and the inspection section is configured to inspect the conduction state between the power generation element of the battery, and the first needle, the second needle, the third needle, and the fourth needle.

3. The conductivity inspection apparatus as claimed in claim 1, wherein the inspection section includes a conductive terminal for attaining the electrical conduction with the power generation element of the battery.

4. The conductivity inspection apparatus as claimed in claim 1, wherein the first surface is parallel to the second surface.

\* \* \* \* \*